(12) United States Patent
Laursen

(10) Patent No.: US 6,521,537 B1
(45) Date of Patent: Feb. 18, 2003

(54) MODIFICATION TO FILL LAYERS FOR INLAYING SEMICONDUCTOR PATTERNS

(75) Inventor: Thomas Laursen, Tempe, AZ (US)

(73) Assignee: SpeedFam-IPEC Corporation, Chandler, AZ (US)

( * ) Notice: Subject to any disclaimer, the term of this patent is extended or adjusted under 35 U.S.C. 154(b) by 0 days.

(21) Appl. No.: 09/703,210

(22) Filed: Oct. 31, 2000

(51) Int. Cl.⁷ .............................................. H01L 21/302
(52) U.S. Cl. ...................................................... 438/692
(58) Field of Search .................... 438/690, 691, 438/692, 761, 763, 778, 783, 927

(56) References Cited

U.S. PATENT DOCUMENTS

| | | | | |
|---|---|---|---|---|
| 5,356,513 A | * | 10/1994 | Burke et al. ................. | 156/636 |
| 5,510,652 A | * | 4/1996 | Burke et al. ................. | 257/752 |
| 5,618,381 A | | 4/1997 | Doan et al. .................. | 438/633 |
| 5,681,423 A | | 10/1997 | Sandhu et al. ............ | 156/636.1 |
| 5,721,172 A | * | 2/1998 | Jang et al. ................... | 438/424 |
| 5,817,567 A | | 10/1998 | Jang et al. ................... | 438/427 |
| 6,071,814 A | * | 6/2000 | Jang ............................ | 438/687 |
| 6,096,230 A | | 8/2000 | Schatz et al. ................. | 276/38 |
| 6,114,246 A | * | 9/2000 | Weling ........................ | 438/691 |
| 6,150,272 A | * | 11/2000 | Liu et al. ..................... | 438/692 |
| 6,169,028 B1 | * | 1/2001 | Wang et al. ................. | 438/653 |
| 6,242,805 B1 | * | 6/2001 | Weling ........................ | 257/752 |
| 2001/0051431 A1 | * | 12/2001 | Chadda et al. .............. | 438/690 |
| 2002/0000271 A1 | * | 1/2002 | Ritzdorf et al. ............. | 148/518 |

OTHER PUBLICATIONS

Laursen et al., Encapsulation of silver by nitridation of Ag–Ti alloy/bilayer structures in Thin Solid Films 290–291 (1996) 411–416.

* cited by examiner

*Primary Examiner*—Richard Elms
*Assistant Examiner*—Beth E. Owens
(74) *Attorney, Agent, or Firm*—Snell & Wilmer, L.L.P.

(57) ABSTRACT

The invention provides a method of fabricating semiconductor chips that includes modifying physical properties of selected deposit fill layers over patterns having up-features and down-features, with fill to be retained in down-features. The modification enhances chemical mechanical polishing rates, or other polishing, of the modified fill layers to reduce dishing of fill material and achieves this without substantially affecting the electrical properties of the final semiconductor chip product.

17 Claims, 6 Drawing Sheets

MODIFICATION TO FILL LAYERS FOR INLAYING SEMICONDUCTOR PATTERNS

CROSS-REFERENCE TO RELATED APPLICATIONS

This application is related to Applicant's U.S. application Ser. No. 09/294,406 filed Apr. 19, 1999, now U.S. Pat. No. 6,258,711 issued Jul. 10, 2001, and is herein incorporated by reference.

BACKGROUND

1. Field of Invention

This invention relates to the fabrication of semiconductor devices. More particularly, it relates to the use of the chemical mechanical polishing (CMP) process for preparing inlaid patterns. The invention involves modifications to the fill layers which result in changed polish rates, which are used to provide improved topography control of the surface during polish and potentially a lower product reject rate.

2. Description of the Related Art

In the fabrication of semiconductor devices, silicon (Si) wafers undergo numerous process steps involving pattern definition, etching, material deposition and excess material removal. Excess material removal is usually carried out by using chemical mechanical polishing (CMP) processes, which also controls the planarity of the wafer surface. Thus far CMP has focused on the rate of material removal, the selectivity ratios between components on a surface being polished, and planarizing capability. The planarization capability may be unique to the CMP process. It should be noted that "planarization" is considered on several levels, e.g. wafer-scale, die-scale and feature-scale.

An example of planarization on a feature scale is shown in FIG. 1, showing the evolution of the trench structure 2' topography as it is being planarized by CMP. The trenches 4' in this example are 0.6 m deep and representative of a polish using a Rodel IC1000 polisher at 2 psi polish pressure. Initially, the pad will not reach down in the trenches 4' and since there is no contact, and therefore no pressure applied to these down-features, only the up-features 6' are polished in levels I and II. When level III is reached, the polish pad contacts the down-features 4' and thus the point is reached where the surface is being planarized. The up-features 6' are in relief and are polished at a higher removal rate than the down features 4'. The fill deposit is usually made sufficiently thick to allow planarization to take place when level IV is reached, as shown in FIG. 1.

There are numerous variations of CMP processing steps during the manufacturing of IC devices on a silicon wafer. Some of these involve inlaying of materials. Examples of these include inlaying a pattern on the device surface of the Si wafer itself, such as where an oxide or another dielectric is inlaid in shallow trenches. Excess dielectric is usually removed by a CMP process for shallow trench isolation (STI). Later on in the device fabrication, patterns of W (tungsten) vias may be inlaid in a dielectric layer where excess W is removed by a CMP process developed for W. Other conductors such as Cu (copper), Al (aluminum), Ag (silver) and Au (gold) can be inlaid in dielectric layers by damascene or dual-damascene processes. There are usually several metallization layers, each requiring a CMP step. Excess metal can be removed by CMP processes tailored for the particular metal in question.

FIGS. 2 and 3 illustrate schematically a simple two-trench line structure having up- and down-features 8', 10' representative of real structures on a device. After pattern definition to form the trenches using, e.g. photolithography and etching of the substrate layer, a fill layer 12' is deposited on top of the substrate 15'. Prior to deposition of the fill material, one or more intermediate layers 14' may or may not be deposited, this is shown schematically in FIG. 2A with the structure having an optional intermediate layer 14'. For the purpose of simplification, the optional intermediate layer(s) will be omitted from the sketches in the following discussion, although in all cases they may or may not be present. Fill deposition is usually done using a conformal deposition 12' as shown in FIG. 2B. However, regardless of initial topography, the CMP process planarizes the surface initially prior to pattern clearing as shown in FIG. 3A. Assuming completely uniform removal, the CMP process produces the planar surface 16' of FIG. 3B. Further polishing, to produce a structure shown in FIG. 3C, poses issues. In practice, due to polish non-uniformity and thickness variations at the outset of polishing, dies and structures are cleared at different polish times, and as a consequence some overpolish cannot be avpided, as shown in FIG. 3D where the fill deposit 12' in down-features 10' is depressed relative to the substrate, as a result. Overpolish may also be needed to ensure that the up-features of the substrate layer are totally free of fill-material residues. Assuming a high-selectivity slurry, where the polish rate of the substrate is negligible in comparison to that of the fill material, there is a strong tendency for dishing within the pattern fill, as shown in FIG. 3D. To the degree that the substrate layer is polished, this removal manifests itself as erosion. When the fill polish rate is the highest, very thin substrate features are particularly prone to erosion due to the force concentration. It is desirable to minimize dishing and erosion after each polish and to obtain as near planar a surface as possible.

It has been an assumption in the description of the CMP process in the above description, that the initial topography is completely planar. However, in situations where the fill thickness is insufficient to reach planarazation, the areas above the up-features of the substrate, layer clear last—this can also be seen from FIG. 1. Even when fill layers are thick, it is known in the art of CMP that some structures are particularly prone to clearing ahead of the field. This has a deleterious effect and increases erosion and dishing.

Most of the present effort to reduce dishing and erosion is focused on process optimization and slurry development, and in some cases costly multi-step and/or multi-slurry solutions have been attempted.

SUMMARY OF THE INVENTION

This summary of invention section is intended to introduce the reader to aspects of the invention and is not a complete description of the invention. Particular aspects of the invention are pointed out in other sections hereinbelow, and the invention is set forth in the appended claims which alone demarcate its scope.

The invention provides a method of fabricating semiconductor chips that includes modifying physical properties of selected deposited patterns to enhance chemical mechanical polishing (CMP), or other polishing, of these patterns without substantially affecting the electrical properties of the final semiconductor chip product. The invention also provides products of the method.

Briefly, in accordance with one aspect of the method of the invention, a modified pattern in the form of a film or layer is deposited on a pattern on a semiconductor wafer that has up- and down-features. The layer is modified through one of several techniques, including inclusion of an additive (another chemical species or alloying composition), stress relieving, or altering of the crystalline structure in order to selectively enhance the removal rate of at least a portion of the layer through chemical mechanical polishing, or other polishing. The selective enhancement of removal rate is particularly important in the damascene and dual-damascene processes, and reduces "dishing" commonly encountered during polishing such layers. Moreover, the removal rate enhancement potentially permits shorter polishing times, and as a consequence, higher chip manufacturing rates.

The invention also provides a semiconductor chip that includes layered microstructures that form electrical circuit (s). At least some of the microstructures include an inlaid composition that has been modified, by chemical additive doping, alloying, stress relieving, or crystalline alteration to alter selectively its polish removal rate in the fabrication stages.

BRIEF DESCRIPTION OF THE DRAWINGS

The following drawings are illustrative of embodiments of the invention and therefore do not limit the scope of the invention, but are presented to assist in providing a proper understanding of the invention. The drawings are illustrative of aspects of the invention (unless indicated as prior art), not to scale, and are intended for use in conjunction with the explanations in the following detailed description section.

DETAILED DESCRIPTION OF THE PREFERRED EMBODIMENT

The invention reduces dishing and erosion of semiconductor chips during fabrication by modifying layers and/or fill material that is deposited over a topography that has up-features and down-features, and wherein material is to be retained in the down-features, such as inlaid metal, oxide and the like materials used in semiconductor fabrication.

In the specification and claims reference is made to "layers" and "multi-layer" structures. It should be understood that a layer that has a portion (upper, lower, etc.) modified may yet be regarded as a "layer." Alternatively, a layer that has modified portions (upper, lower, etc.) can also be viewed as a "multi-layer," i.e. made up of more than one "layer." The context of the descriptions herein makes it clear to a person of skill in the art willing to learn, what is being referenced by these terms.

According to an embodiment of the invention, the early part of the fill deposition process is modified in such a way that the lower part of the fill has a higher polish rate. It is also a requirement of the invention that the modified material left behind after polishing does not substantially affect the functionality of the structures being fabricated. Because the fill layer is deposited onto a substrate layer with a topography having up- and down-features, the polish rate on the up-features may be expected to be enhanced prior to pattern clearing.

Figure 1:
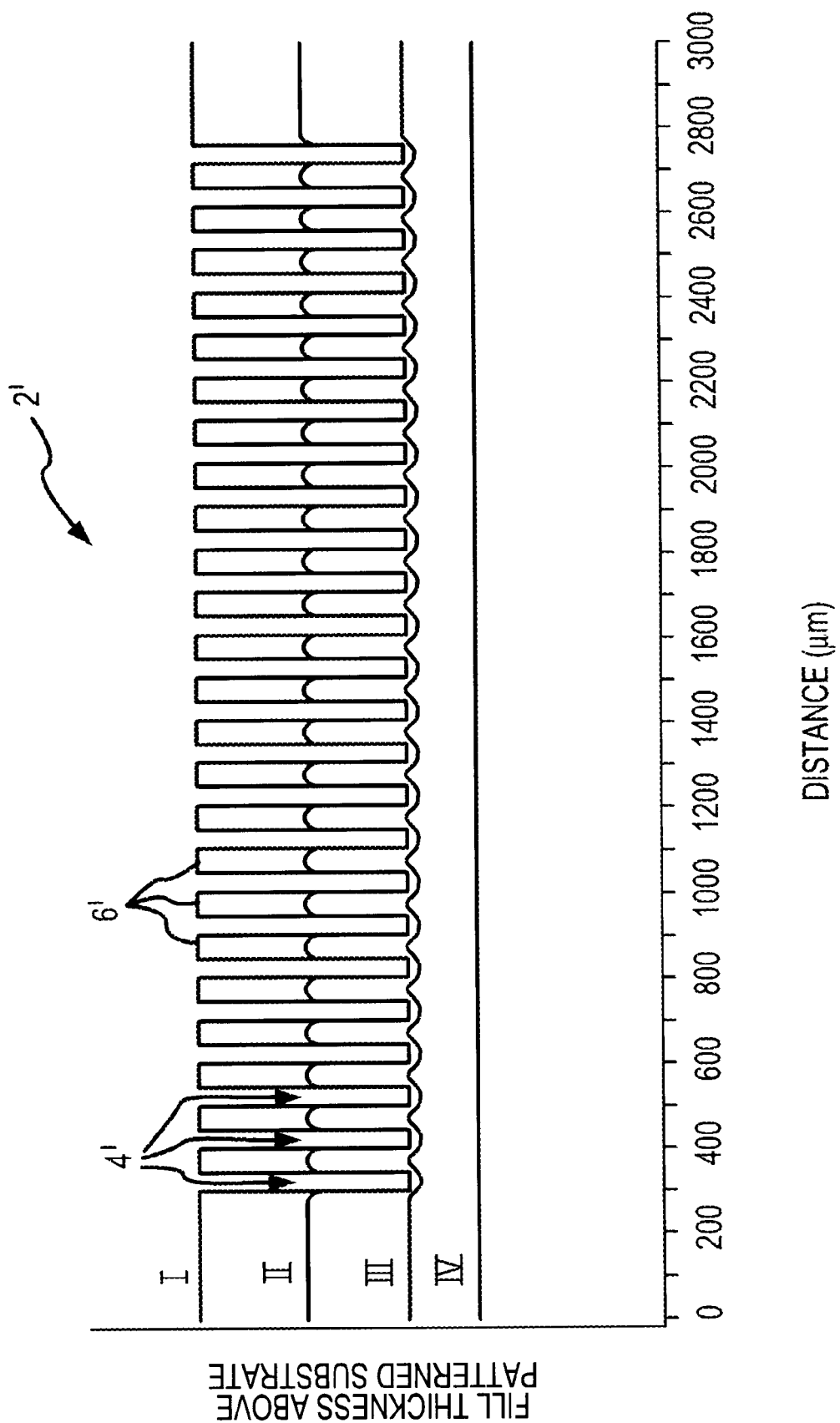
FIG. 1 schematically illustrates the evolution of a trench-structure topography being planarized by the polish. The trenches in this example are about 0.6 μm deep and representative of polish using Rodel IC1000 and 2 psi polish pressure (prior art)
Figure 2A:
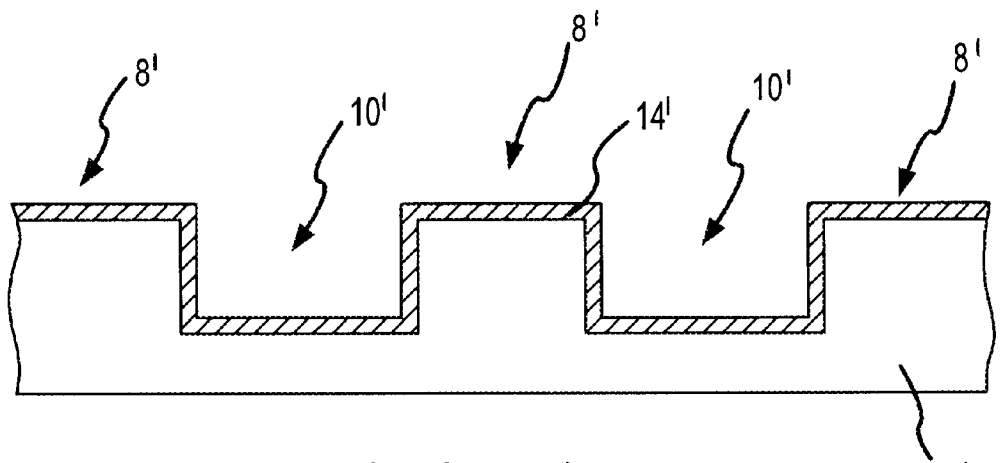
FIG. 2A illustrates a patterned substrate layer as in FIG. 1, but with an optional thin intermediate layer (prior art)
Figure 2B:
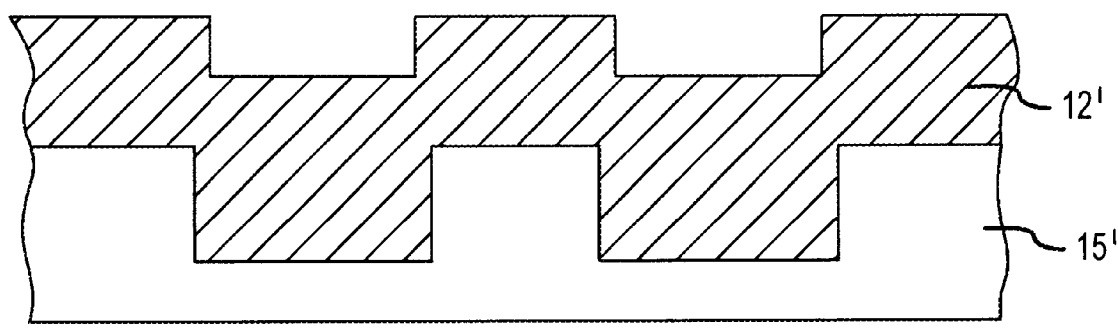
FIG. 2B illustrates fill deposition using a conformal deposition (prior art)
Figure 3A:
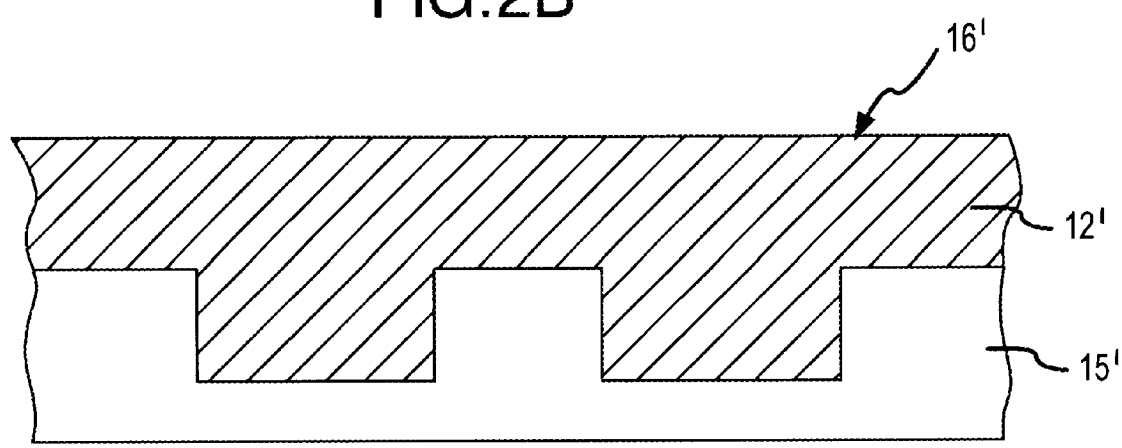
FIGS. 3A–D illustrate the CMP steps of clearing the two-trench structure and the resulting dishing (prior art)
Figure 3B:
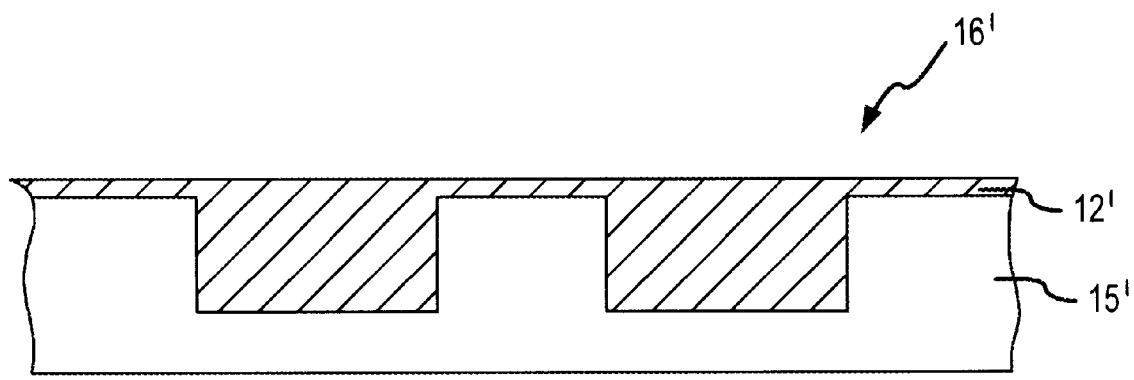
Figure 3C:
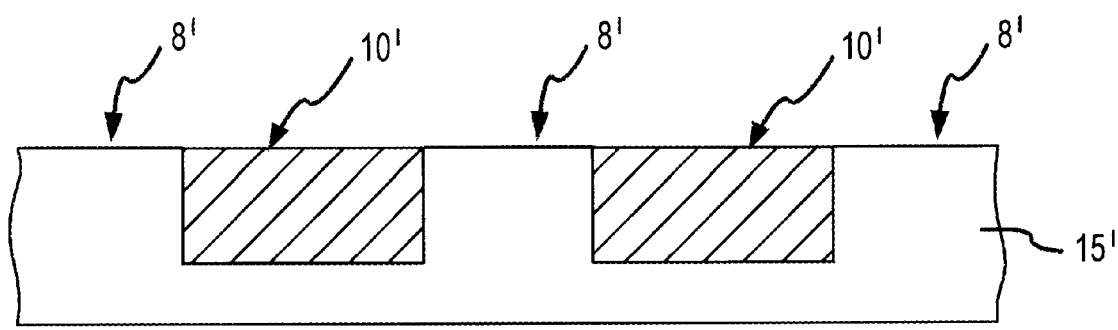
Figure 3D:
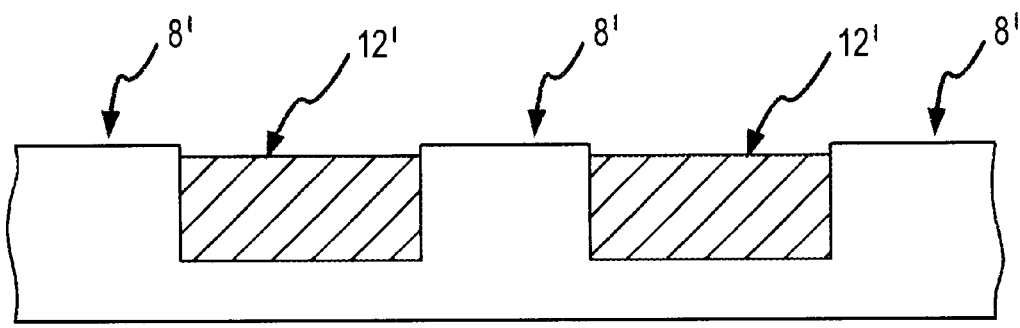
Figure 4A:
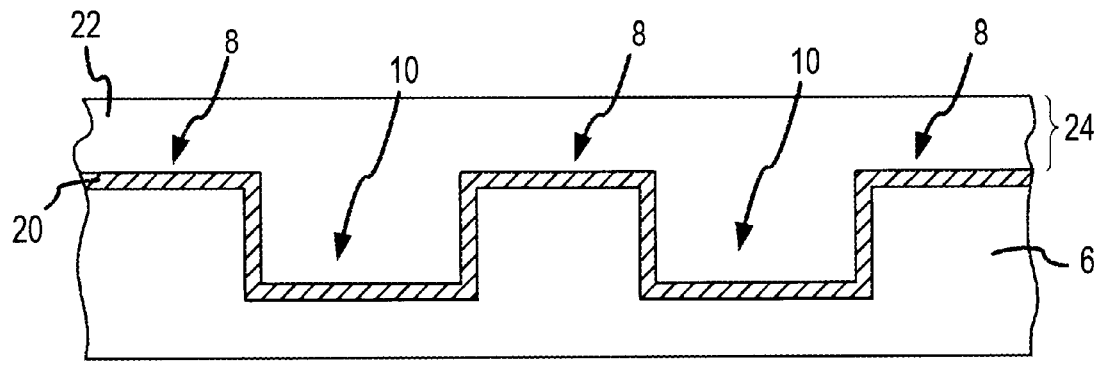
FIGS. 4A–D illustrate an embodiment of the invention in clearing a two-trench structure having a modified lower part, according to the present invention using CMP.
Figure 4B:
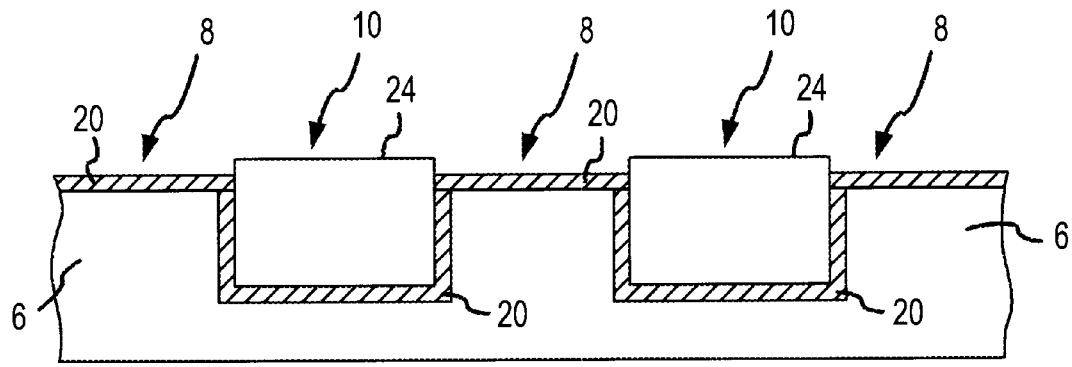
Figure 4C:
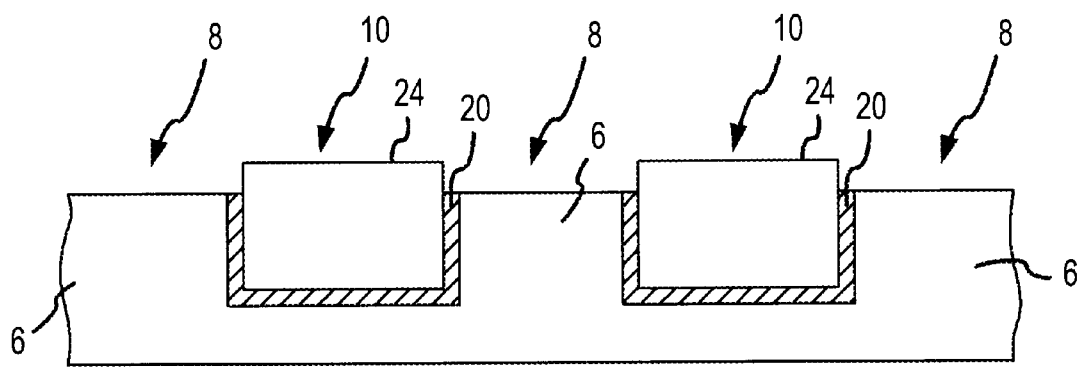
Figure 4D:
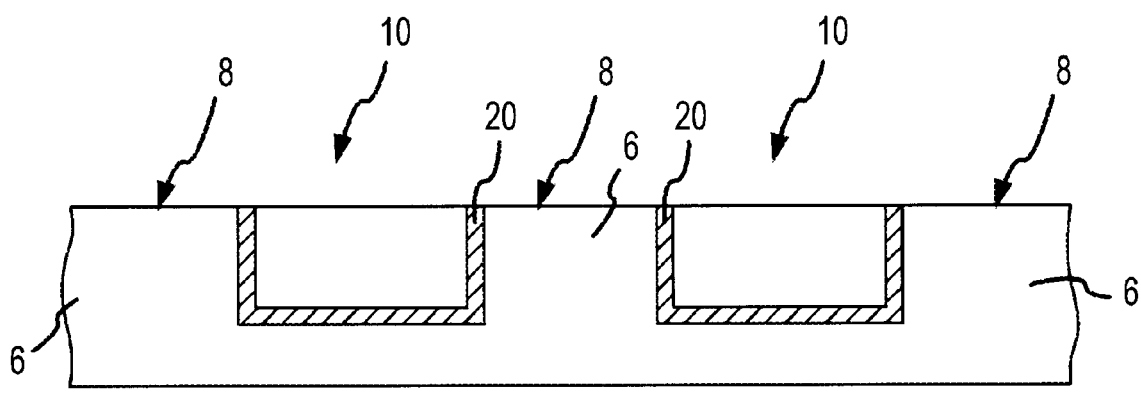

An embodiment of the process of the invention is shown schematically in FIGS. 4A–D, representing a simple two-trench structure having up- and down-features, used as an illustrative non-limiting example. An optional intermediate layer may or may not be present, but is omitted from the diagrams for simplification. The embodiment has a substrate 6, with up-features 8 and down-features 10, overlaid by a conformal layer having a first-deposited modified portion 20, according to the invention. The modified portion of layer 20 is overlaid with the remaining, unmodified portion that is designated fill layer portion 22. As the CMP process continues, the polish rate is enhanced above the up-features 8 of the substrate layer from the moment the polish reaches the modified part 20 of the fill layer 24 as shown in FIG. 4B. Later, at the point when the field clears the fill, the trench structures 10 in FIG. 4C still have remaining protruding fill structures 10 of material 24, but after some overpolish these will be coplanar with the substrate layer surface (field) as shown in FIG. 4D.

Introducing a modification, in accordance with the invention, to the lower part of the fill layer should also reduce or eliminate problems caused when particular structures clear ahead of the field. This is because field clearing is enhanced by the invention. The invention provides the opportunity to reduce the thickness of the fill deposition because planarization will be reached faster when up-features are polished faster—this effect can save costs both in terms of process time and in the terms of the cost of the fill material.

The invention also reduces dishing and erosion that arises in the situation where overpolish of the substrate-layer's up-features are desired in order to ensure complete clearing of any fill residue, by reducing the need to overpolish. Reduction in dishing and erosion may be expected to decrease the proportion of rejected ICs fabricated on a wafer. The overall improvement provided by embodiment of this invention is expected to reduce the need for more costly multi-step and/or multi-slurry processes.

An application of another embodiment of the present invention can be applied in shallow-trench isolation (STI) polishing. In this case according to the invention, for example, an insulating layer—usually oxide—is deposited on a patterned Si wafer having ~6,000 Å deep trenches and a ~2,000 Å thick nitride layer covering the active areas. The dielectric deposit usually takes place by either physical vapor deposition (PVD) or spin-on-glass (SOG) and is about 10,000 Å thick.

An extension of the previous example is to choose the standard oxide-dielectric as one component of a dielectric stack and a doped oxide as another. F-doped oxides (F-SiO$_2$) and SiCOH (C—SiO$_2$) have very different polish rates than the undoped oxides; e.g. SiCOH has (in one case) been observed to have a rate 85% lower than that of pure oxide. The modified polishing characteristics may be attributed to changed hardness, plasticity, or other mechanical properties. F- and C-doped oxides are usually used as low-k dielectrics for interconnect fabrication.

In one embodiment of the invention, silicon oxide is deposited with a dopant, such as F, C, or B, to produce a modified silicon oxide. This first dopant-modified deposition is followed by the standard undoped oxide deposition.

An even greater effect could be obtained by first depositing a pattern of F—SiO$_2$ followed by C—SiO$_2$, because of their very different polish rates.

In the state of the art of the dual-damascene process for Cu metallization, Cu is deposited in two steps. For example, first, ~1,000 Å of a seed layer is deposited using physical vapor deposition (PVD) followed by ~1 $\mu$m of electroplated Cu. This combination has not been explored for its useful polish-rate ratios, but this could be optimized by varying either deposition conditions affecting the microstructure or introducing dopants or alloying element by co-deposition.

It is known in the art that Cu polish rates vary significantly depending upon the deposition process—PVD, chemical vapor deposition (CVD), electrochemical deposition, etc. Furthermore, even for the same deposition process, wafers obtained from different manufacturers exhibit substantial variation. In addition, microstructural changes in connection with room temperature annealing have been shown to cause a 35% increase in polish rate. This means that polish rates can be modified by controlled microstructural changes of the deposited Cu.

Alloying and doping is another way of modifying polish rates. In general, alloyed and doped films have different oxidation characteristics from the starting material, and the surface layer's mechanical properties (hardness, plasticity) are also affected by the presence of dopants. Since passivation of the metal surface by oxidation and oxide abrasion are key components of the CMP mechanism, the polish rate of the fill material can be tailored to a particular application.

When depositing a Cu bilayer in accordance with the invention, it is important to deposit the layer with the highest polish rate first and to ensure that any modification of the Cu does not substantially deteriorate its resistivity or electromigration resistance. Microstructural changes usually result in only moderate resistivity changes. Incorporating impurities Mg, Ta, Mo, Y, Cr, Al, Si, Ti, V and the like at low concentration, and sequestering them at grain boundaries can be achieved while keeping conductivity and structural changes to a minimum. As a special case, the miscibility of Cu and Ag should allow a wide dopant concentration range with good conductivity and small structural changes, which is expected to provide a layer having polish rates different from Cu as well as Ag.

For modified Cu deposits having a slower polish rate, improved clearing planarization can be obtained by depositing the modified layer as either a modified layer with high polish rate at the bottom, or depositing a modified layer with low polish rate at the top. The top layer modification may not be as efficient for planar pattern clearing as the other, but has the advantage of not affecting the trench material at all.

Figure 5A:
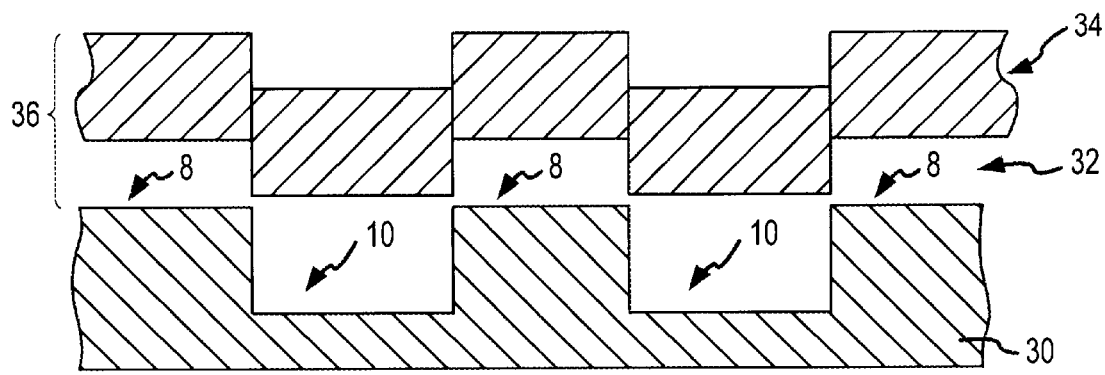
FIGS. 5A–C illustrate another embodiment of the invention wherein a top portion of a fill layer is modified to decrease polish removal rate.
Figure 5B:
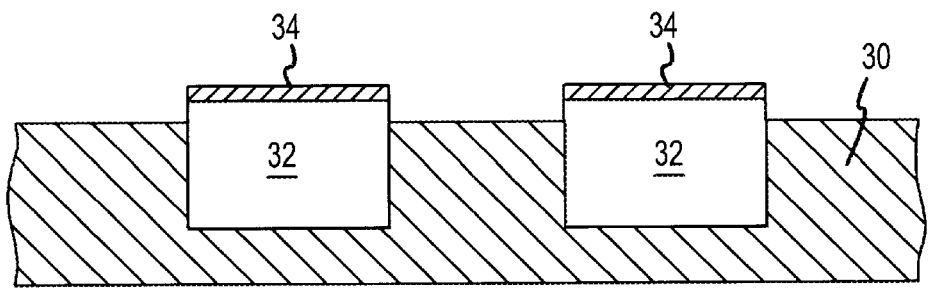
Figure 5C:
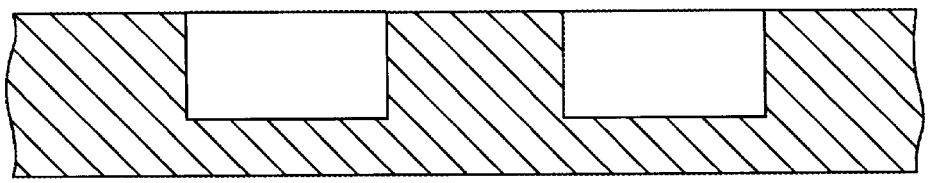

FIGS. 5A–5C illustrate an embodiment of the invention wherein conformal multilayer 36 includes an upper portion 34, that has a reduced polish removal rate, and lower portion 32. Layer 36 overlies a substrate 30 that has down-features 10 and up-features 8. When polishing proceeds, the bulk layer 34 is removed, but at a slower rate than removal of material from layer 32, resulting in the "capped" structure illustrated schematically in FIG. 5B. Continued polishing removes the caps over the entrenched material to produce the structure of FIG. 5C free of dishing effects.

The above specification, examples and data provide a complete description of the manufacture and use of the invention. Since many embodiments of the invention can be made without departing from the spirit and scope of the invention, the invention resides in the claims hereinafter appended.

I claim:
1. A method for fabricating semiconductor chips, the method comprising:
   (a) selecting a semiconductor wafer having a patterned topography on a surface thereof, the pattern comprising structures having up- and down-features;
   (b) depositing a multi-layer fill stack over the patterned topography, layers of the stack having different polish rates, with an earliest deposited layer having the highest polish rate conformally inlaid in said down-features; and
   (c) subjecting the multi-layer fill stack to polishing until a cleared surface of the multi-layer fill stack is polished to substantial planarity with a surrounding wafer surface.

2. The method in claim 1, further comprising: depositing a thin intermediate layer prior to depositing the multi-layer fill stack.

3. The method of claim 1, wherein the depositing of a multi-layer fill stack comprises: depositing a layer of copper with an additive therein, the additive comprising a metal selected from the group consisting of magnesium, tantalum, molybdenum, yttrium, chromium, aluminum, silicon, titanium and vanadium.

4. The method of claim 1, wherein the multi-layer fill stack comprises: a layer of silicon oxide comprising an additive selected from the group consisting of fluorine, carbon and boron.

5. The method of claim 1, wherein the step of subjecting comprises subjecting to chemical-mechanical polishing.

6. The method of claim 2, wherein the patterned topography comprises a patterned substrate layer, the patterned substrate layer selected from oxide dielectric and low-k dielectric layers, and wherein the intermediate layer comprises a thin barrier layer selected from Ta, W, Ti and their nitrides and oxides; and wherein the multi-layer fill stack comprises a modified seedlayer and electroplated Cu.

7. The method of claim 4, wherein the patterned topography comprises a patterned substrate comprising silicon, and the intermediate layer is a thin nitride layer on up-features; and the multi-layer fill stack comprises a doped oxide having a dopant concentration gradient.

8. A method of fabricating semiconductor chips, the method comprising:
   (a) selecting a semiconductor wafer having a patterned topography;
   (b) depositing a multi-layer fill stack over the patterned topography, layers of the multi-layer fill stack having different polish rates, with an earliest deposited layer, having the highest polish rate, conformally inlaid in any downfeatures contained within the patterned topography; and
   (c) subjecting the multi-layer fill stack to polishing until the multi-layer fill stack is polished to substantial planarity with a surrounding wafer surface.

9. The method of claim 8, further comprising: depositing a thin intermediate layer prior to depositing the multi-layer fill stack.

10. The method of claim 8, further comprising depositing an optional thin intermediate layer prior to depositing the multi-layer stack fill.

11. The method of claim 8, wherein the patterned topography comprises silicon, the intermediate layer comprises a thin nitride layer on up-features, and the multi-layer fill stack is comprised of low-k dielectric and silicon oxide.

12. The method of claim 8, wherein the patterned topography comprises a patterned substrate, the substrate comprising silicon; the intermediate layer is a thin nitride on up-features, and the multi-layer full stack is comprised of fluorine-doped oxide and undoped oxide.

13. A method of fabricating semiconductor chips, the method comprising:
  (a) selecting a silicon wafer;
  (b) depositing a fill layer over a pattern on a surface of the silicon wafer having up-features and down-features, the deposited fill layer comprising an additive in a first deposited portion of the fill layer, the additive modifying a polish removal rate of the first deposited portion of the fill layer without substantially affecting an electrical property thereof wherein the first deposited portion is conformally inlaid in said down features; and
  (c) subjecting the fill layer to polishing to planarize the wafer surface.

14. The method of claim 13, wherein the depositing comprises depositing a fill layer of copper with an additive therein comprising a metal selected from the group consisting of magnesium, tantalum, molybdenum, yttrium, chromium, aluminum, silicon, titanium and vanadium.

15. The method of claim 13, wherein the depositing comprises depositing a fill layer of a first metal, and the additive comprises a second metal capable of alloying with the first metal.

16. The method of claim 13, wherein the fill layer comprises silicon oxide, and the additive is selected from the group consisting of fluorine, carbon and boron.

17. The method of claim 13, wherein the step of subjecting comprises subjecting to chemical-mechanical planarization.

* * * * *